United States Patent [19]

Lew et al.

[11] Patent Number: 5,504,789
[45] Date of Patent: Apr. 2, 1996

[54] PHASE DETETION METHOD FOR FLOW MEASUREMENT AND OTHER APPLICATIONS

[76] Inventors: Hyok S. Lew; Yon S. Lew; Yon K. Lew, all of 7890 Oak St., Arvada, Colo. 80005

[21] Appl. No.: 91,269

[22] Filed: Jul. 15, 1993

[51] Int. Cl.⁶ .......................... G06F 7/38; H03K 19/003
[52] U.S. Cl. ................... 377/21; 327/12; 327/48; 324/76.55; 324/76.62
[58] Field of Search .................. 327/12, 48; 377/21; 324/76.55, 76.62

[56] References Cited

U.S. PATENT DOCUMENTS

| 4,531,193 | 7/1985 | Yasuhara et al. | 377/21 |
| 5,225,995 | 7/1993 | Fujiwara et al. | 377/21 |

*Primary Examiner*—Margaret R. Wambach

[57] ABSTRACT

A phase angle difference between two alternating electrical signals is determined as a function of a ratio of a differential combination of two different numbers of pulse counts to an additive combination of the two different numbers of pulse counts, wherein the first of the two different numbers of pulse counts is obtained by counting a series of electric pulses generated by an electrical pulse generator in a time interval between an occurrence of zero value of the leading signal of the two alternating electrical signal and (i−1)th occurrence of zero value of the trailing signal of the two alternating electrical signals occurring after the occurrence of zero value of the leading signal, and the second of the two different numbers of pulse counts is obtained by counting the pulses in an time interval between an occurrence of zero value of the trailing signal and the (j)th occurrence of zero value of the leading signal occurring after the occurrence of zero value of the trailing signal, wherein (i) and (j) are integers; and the phase angle so determined is used to determine the mass flow rate of media by using a convective inertia force flowmeter.

22 Claims, 6 Drawing Sheets

5,504,789

1

PHASE DETETION METHOD FOR FLOW MEASUREMENT AND OTHER APPLICATIONS

FIELD OF INVENTION

This invention relates to methods for determining the phase angle difference between two alternating electrical signals in general applications, and methods for determining the flow rate of fluid media as a function of the phase angle difference between two alternating electrical signals respectively generated by two alternating electrical signal generators included in a flowmeter such as a convective inertia force flowmeter (Coriolis force flowmeter), or a rotameter, wherein the phase angle difference is determined by the method taught by the present invention.

BACKGROUND OF INVENTION

One of the most important applications of methods for determining the phase angle difference between two alternating electrical signals is the measurement of fluid flow by using a flowmeter that generates two alternating electrical signals with a phase angle difference therebetween varying as a function of the flow rate of fluids. For example, the mass flow rate of media moving through a flexurally vibrating conduit is proportional to the phase angle difference between two alternating electrical signals respectively representing the flexural vibrations of the two opposite halves of the vibrating conduit included in a convective inertia force flowmeter (Coriolis force flowmeter). Earlier inventions made by one or more of the inventors of the present invention disclose methods for determining flow rate of fluids moving through a rotameter as a function of the phase angle difference between two alternating electrical signals representing the position of the float included in the rotameter, and methods for determining the level of liquids as a function of the phase angle difference between two alternating electrical signals representing the position of a float floating on the free surface of liquids (U.S. patent application Ser. No. 036,953); and methods for determining the position and velocity of an object as a function of the phase angle difference between the transmitted wave towards the object and the reflected wave from the object and as a function of the time rate of change of the phase angle difference, respectively (U.S. patent application Ser. No. 024,222). In addition to the afore-mentioned applications, there are numerous other applications of the methods for determining the phase angle difference between two alternating electrical signals in the engineering, industrial and scientific fields as well as in the commercial and military areas. Therefore, a highly economic and extremely accurate method for determining the phase angle difference between two alternating electrical signals has an important ramification in terms of technical applications as well as financial value.

BRIEF SUMMARY OF INVENTION

The primary object of the present invention is to provide a highly economic and extremely accurate method for determining the phase angle difference between two alternating electrical signals.

Another object is to provide a method that determines the phase angle difference between two alternating electrical signals as a function of a ratio of a differential combination of two numbers of pulse counts to an additive combination of the two numbers of pulse counts, wherein the first of the two numbers of pulse counts is obtained by counting the number of electric pulses generated by a pulse generator in a time period between an occurrence of a zero value of the leading signal of the two alternating electrical signals and the (i−1)th occurrence of zero value of the trailing signal of the two alternating electrical signals occurring after the occurrence of the zero value of the leading signal, and the second of the two numbers of pulse counts is obtained by counting the number of pulses in a time period between an occurrence of a zero value of the trailing signal and the (j)th occurrence of zero value of the leading signal occurring after the occurrence of the zero value of the trailing signal, where (i) and (j) are respectively equal to an integer.

A further object is to provide a method that determines the phase angle difference between two alternating electrical signals as a function of a ratio of a differential combination of two numbers of pulse counts to an additive combination of the two numbers of pulse counts, wherein the first of the two numbers of pulse counts is obtained by counting the number of electric pulses generated by a pulse generator in a time period between an occurrence of a zero value of one of the two alternating electrical signals and the (i)th occurrence of zero value of the other of the two alternating electrical signals occurring after the occurrence of the zero value of the one of the two alternating electrical signals, and the second of the two numbers of pulse counts is obtained by counting the number of pulses in a time period between an occurrence of a zero value of either one of the two alternating electrical signals and the (j)th occurrence of zero value of the same either one of the two alternating electrical signals occurring after the occurrence of the zero value of the either one of the two alternating electrical signals, where (i) and (j) are respectively equal to an integer.

Yet another object is to provide a method for determining the phase angle difference as a function of ratio of a differential combination of a summation of the first number of pulse count cumulatively summed over a plurality of cycles of counting and a summation of the second number of pulse count cumulatively summed over the same plurality of cycles of counting to an additive combination of the summation of the first number of pulse count and the summation of the second number of pulse count, wherein the first and second number of pulse count are respectively equal to the first and the second of the two numbers of pulse counts defined in either one of the afore-mentioned another object and a further object of the present invention.

Yet a further object is to provide a method for determining the phase angle difference between two alternating electrical signals respectively generated by two motion sensors included in a convective inertia force flowmeter (Coriolis force flowmeter) and respectively representing flexural vibrations of two opposite halves of a single or a pair of vibrating conduits included in the convective inertia force flowmeter, wherein the mass flow rate of media moving through the single or the pair of vibrating conduits is determined as a function of the phase angle difference determined by the method of the present invention.

These and other objects of the present inventions will become clear as the description of the inventions progresses.

BRIEF DESCRIPTION OF FIGURES

The present inventions may be described with a greater clarity and specificity by referring to the following figures.

DESCRIPTION OF ILLUSTRATED EMBODIMENTS

Figure 1:
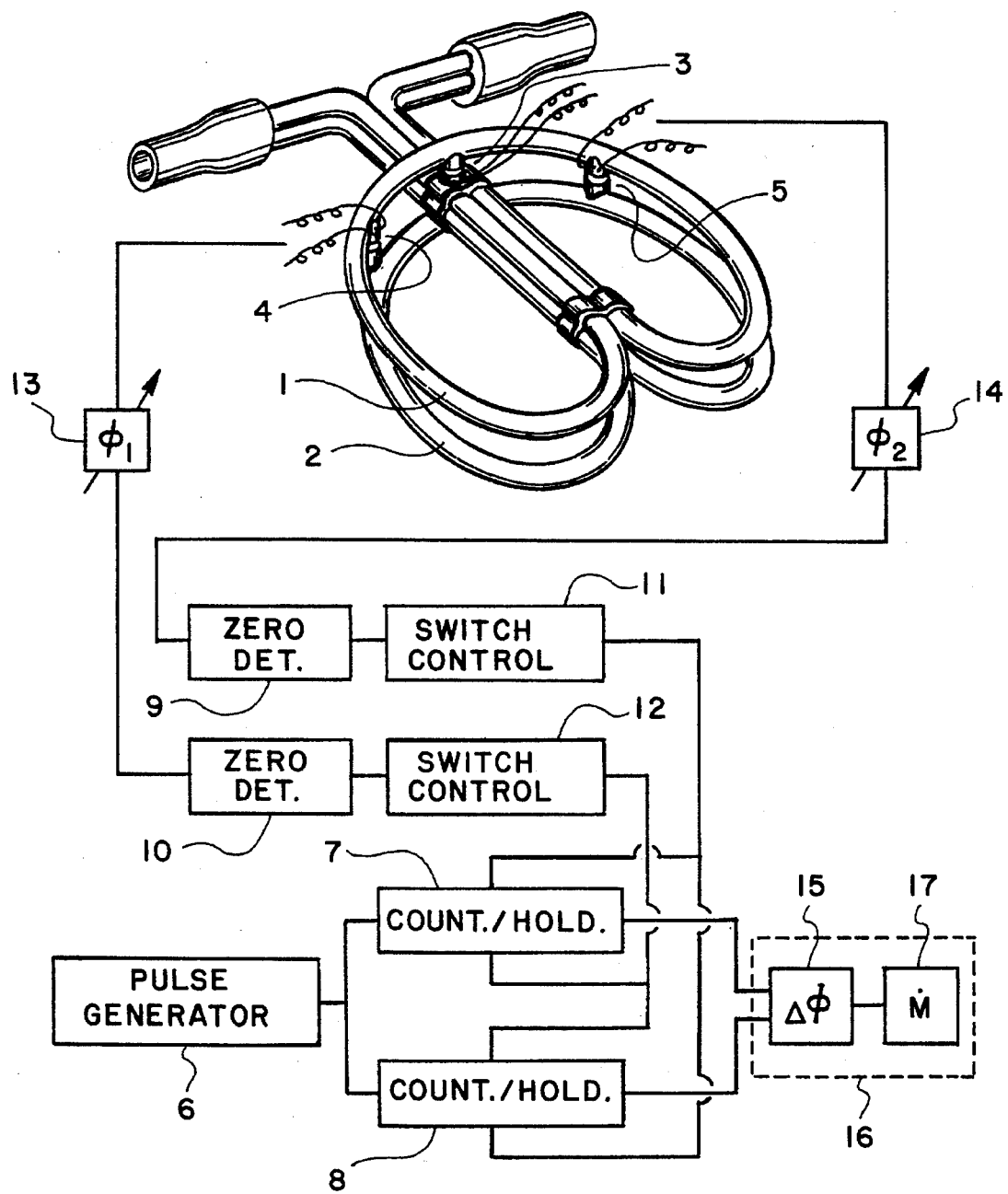
FIG. 1 illustrates a mode of operating principles of a convective inertia force flowmeter (Coriolis force flowmeter) that determines the mass flow rate of media as a function of the phase angle difference determined by the method of the present invention.

When a conduit with two extremities secured to a supporting structure has a geometry symmetric about the center section of the conduit dividing the conduit into two equal opposite halves, and an electromagnetic vibrator disposed on a center plane perpendicularly intersecting with the center section of the conduit and dividing the conduit into the two equal opposite halves generates a flexural vibration of the conduit, the conduit experiences a primary flexural vibration of symmetric mode with respect to the center plane as a result of the vibratory force exerted by the electromagnetic vibrator and a secondary flexural vibration of antisymmetric mode with respect to the center plane as a result of the dynamic interaction between the symmetric primary flexural vibration of the conduit and the convective inertia force of the fluid media moving through the conduit. It can be easily shown by simultaneously solving the equations of motions of a conduit under flexural vibration and of fluid media moving through the conduit that the resultant flexural vibration of the conduit created by the combined effect of the vibratory force exerted by the electromagnetic vibrator and the inertia force of the fluid media moving through the conduit is described by the following equation:

$$v(x,t) = v_0(x)\cos\omega t + \frac{\omega \dot{M}}{EI} v_1(x)\sin\omega t, \tag{1}$$

where $v(x,t)$ is the velocity of the flexural vibration of the conduit occurring at a section at a distance x from the center section of the conduit and at a time t, $\omega$ is the circular frequency of the flexural vibration of the conduit, $\dot{M}$ is the mass flow rate of fluid media moving through the conduit, E is the modulus of elasticity of the material making up the conduit, I is the moment of inertia of the cross sectional area of the conduit, $v_0(x)\cos\omega t$ is the primary flexural vibration of the conduit created by the vibratory force exerted by the electromagnetic vibrator, and $(\omega\dot{M}/EI)v_1(x)\sin\omega t$ is the secondary flexural vibration of the conduit created by the dynamic interaction between the primary flexural vibration of the conduit and the convective motion of fluid media moving through the conduit; wherein $v_1(x)$ is related to $v_0(x)$ by the following differential equation:

$$\frac{d^4 v_1(x)}{dx^4} - \frac{m + \rho S}{EI} \omega^2 v_1(x) = -\frac{dv_0(x)}{dx}, \tag{2}$$

where m is the mass of the conduit per unit length thereof, $\rho$ is the density of the fluid media moving through the conduit, and S is the cross sectional area of the flow passage provided by the conduit. When the conduit containing the fluid media is flexurally vibrated at a natural frequency thereof, which natural frequency is given by equation $$\omega = K\sqrt{\frac{EI}{m+\rho S}}, \tag{3}$$

equation (2) reduces to the following form:

$$\frac{d^4 v_1(x)}{dx^4} - K^2 v_1(x) = -\frac{dv_0(x)}{dx}, \tag{4}$$

where K is a characteristic constant determined by the boundary conditions of the vibrating conduit. By using the addition or subtraction formula of the trigonometric functions, it can be easily shown that equation (1) can be written in the form $$v(x,t) = A(x)\{\cos[\omega t - \phi(x)]\}, \tag{5}$$

where $$A(x) = \sqrt{[v_0(x)]^2 + \left[\frac{\omega \dot{M}}{EI} v_1(x)\right]^2}, \tag{6}$$

and $$\tan\phi(x) = \frac{v_1(x)}{v_0(x)} \frac{\omega \dot{M}}{EI}. \tag{7}$$

Two motion sensors respectively located at x=a and x=b provide two alternating electrical signals respectively proportional to $v(x,t)$ given by equation (5) wherein x therein is now substituted with a and b, which two alternating electrical signals are of the following forms:

$$E_a(t) = \alpha A(a)\cos[\omega t - \phi(a)], \tag{8}$$

and $$E_b(t) = \beta A(b)\cos[\omega t - \phi(b)], \tag{9}$$

where $$\tan\phi(a) = \frac{v_1(a)}{v_0(a)} \frac{\omega \dot{M}}{EI}, \tag{10}$$

$$\tan\phi(b) = \frac{v_1(b)}{v_0(b)} \frac{\omega \dot{M}}{EI}, \tag{11}$$

and $\alpha$ and $\beta$ are respectively the electrical amplification coefficients associated with the two motion sensors and the preamplifiers thereof.

Equations (10) and (11) can be combined to obtain a relationship between the mass flow rate $\dot{M}$ and the phase angles of the two alternating electrical signals given by the following equation:

$$\dot{M} = \frac{EI}{2\omega} \left[ \frac{v_0(a)}{v_1(a)} \tan\phi(a) + \frac{v_0(b)}{v_1(b)} \tan\phi(b) \right]. \quad (12)$$

It should be understood that equations (1) through (9) are valid for all modes of flexural vibration of the conduit, which may be symmetric, antisymmetric or asymmetric about the center section of the conduit. In general, the amplitude ratio of the secondary flexural vibration to the primary flexural vibration, $(v_1/v_0)$, as well as the magnitude of the term $(\omega M/EI)$ is much smaller than unity. Consequently, the addition of the two tangent functions appearing on the right hand side of equation (12) can be approximated by the tangent of addition of the two angles $\phi(a)$ and $\phi(b)$. When the conduit is vibrated in a symmetric mode about the center section of the conduit, equation (12) can be reduced to the form $$\dot{M} = C \tan[\phi(a) - \phi(b)], \quad (13)$$

where $$C = \frac{EI}{\omega} \frac{v_0}{v_1}. \quad (14)$$

When the phase angle difference $[\phi(a)-\phi(b)]$ is less than five degrees, equation (13) can be approximated by equation $$\dot{M} = C[\phi(a)-\phi(b)]. \quad (15)$$

According to equation (13) or (15), the mass flow rate $\dot{M}$ is proportional to the phase angle difference between two alternating electrical signals respectively generated by two motion sensors and respectively representing the the flexural vibrations of the two opposite halves of the conduit. The constant of proportionality C given by equation (14) is a constant as long as the natural frequency $\omega$ of the flexural vibration of the conduit remains a constant and the modulus of elasticity E of the material making up the conduit remains unchanged. When equation (3) is substituted into equation (14), the constant of proportionality C can be defined in the form $$C = \frac{\omega(m+\rho S)}{K^2} \frac{v_0}{v_1}. \quad (16)$$

Equations (13) through (16) suggest that the mass flow rate of media can be determined as a function of the phase angle difference, or of a ratio of the phase angle difference to the frequency of the flexural vibration of the conduit, or of a product of the phase angle difference and the frequency of the flexural vibration of the conduit.

In FIG. 1 there is illustrated an embodiment of the convective inertia force flowmeter (Coriolis flowmeter) that determines the mass flow rate of media moving through a pair of conduits 1 and 2 flexurally vibrated relative to one another by an electromagnetic vibrator 3. In an alternate design, a single conduit may be employed in place of the pair of conduits shown in the particular illustrative embodiment. A pair of motion sensors 4 and 5 located symmetrically about the center section of the conduit respectively generate two alternating electrical signals representing the flexural vibrations of the two opposite halves of the conduit. The two alternating electrical signals respectively generated by the two motion sensors 4 and 5 are of the forms given by equations (8) and (9). An electrical pulse generator 6 continuously generates a series of electric pulses at a known or unknown frequency. Each of a pair of pulse counters 7 and 8 starts to count the number of pulses generated by the pulse generator 6 at an instant when the "start-count" switch included in the pulse counter is turned on, and stops counting at an instant when the "stop-count" switch is turned on, whereupon the pulse counter holds the number of pulses counted in a time interval between the switch on of the "start-count" switch and switch on of the "stop-count" switch, The pulse counter resets itself to the "zero number of pulses counted" at an instant when the "reset switch" is switched on. Each of a pair of zero-crossing detectors 9 and 10 detecting the occurrences of zero values of each of the two alternating electrical signals, provides the input to each of a pair of switch controllers 11 and 12, that controls the counting of, holding by and resetting of each of the two pulse counters 7 and 8. One or more variable phase angle imposing devices 13 and 14 may be included, which impose an artificial phase angle difference between the two alternating electrical signals in such a way that the phase angle difference is set to zero, when the mass flow rate of media is equal to zero. A phase angle detector 15 included in a data processor or micro-processor 16 determines the phase angle difference between the two alternating electrical signals respectively generated by the two motion sensors 4 and 5 as a function of the two numbers of pulse counts respectively supplied by the two pulse counters 7 and 8. A data processor 17 determines the mass flow rate of media as a function of the phase angle difference determined by the phase angle detector 15 by using an empirically obtained mathematical relationship therebetween, which is an empirical counterpart of equation (13) or (15). A detailed description of the working of the data collecting and processing system shown in FIGS. 1 and 2 will be discussed in conjunction with FIGS. 3 through 11.

Figure 2:
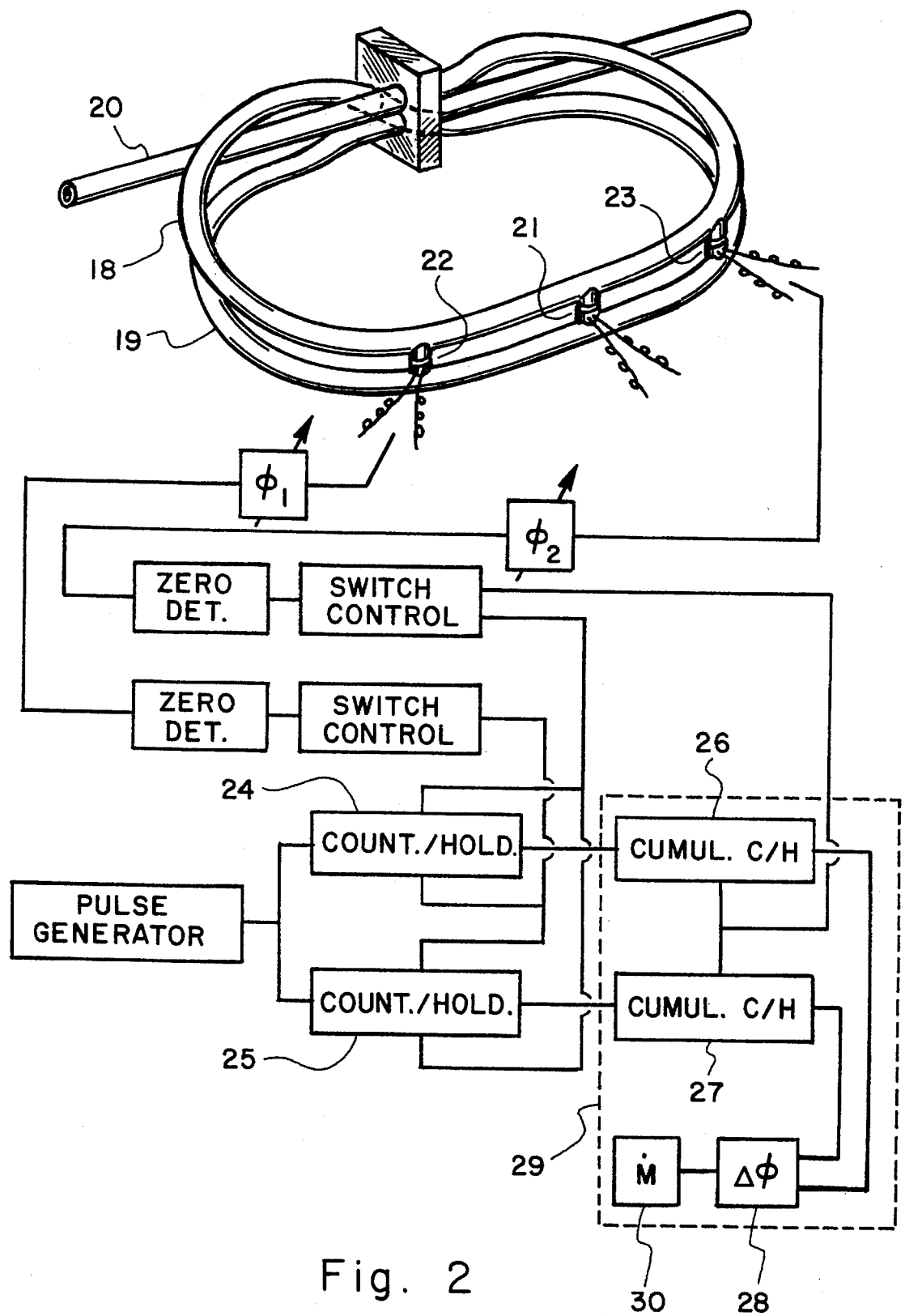
FIG. 2 illustrates another mode of operating principles of a convective inertia force flowmeter (Coriolis force flowmeter) that determines the mass flow rate of media as a function of the phase angle difference determined by the method of the present invention.

In FIG. 2 there is illustrated another embodiment of the convective inertia force flowmeter (Coriolis force flowmeter) that operates on essentially the same principles as those described in conjunction with the embodiment shown in FIG. 1. The pair of parallel loops of conduit 18 and 19 under a relative flexural vibration belongs to a single continuous conduit 20. The electromagnetic vibrator 21 providing a vibratory force is disposed on a plane of symmetry dividing the combination of the two loops 18 and 19 into two equal opposite halves, while the pair of motion sensors 22 and 23 are disposed on two opposite sides of the plane of symmetry in a symmetric relationship. The data processing system shown in this particular illustrative embodiment is essentially the same as that shown in and described in conjunction with FIG. 1 with the following exception: Each of a pair of cumulative counters 26 and 27 takes a summation of the number of pulse count supplied by each of the two pulse counters 24 and 25 by summing the pulse count over a predetermined number of cycles of counting by the pulse counter. The phase detector 28 included in the data processor or micro-processor 29 determines the phase angle difference between the two alternating electrical signals as a function of the two cumulative summations of the pulse counts, and the data processor 30 determines the mass flow rate of media as a function of the phase angle difference so determined. It should be understood that, as there are a number of pulse counters with a built-in microprocessor available at the present time, the pulse counter and the cumulative counter can be readily combined into a single integrated unit.

Figure 3:
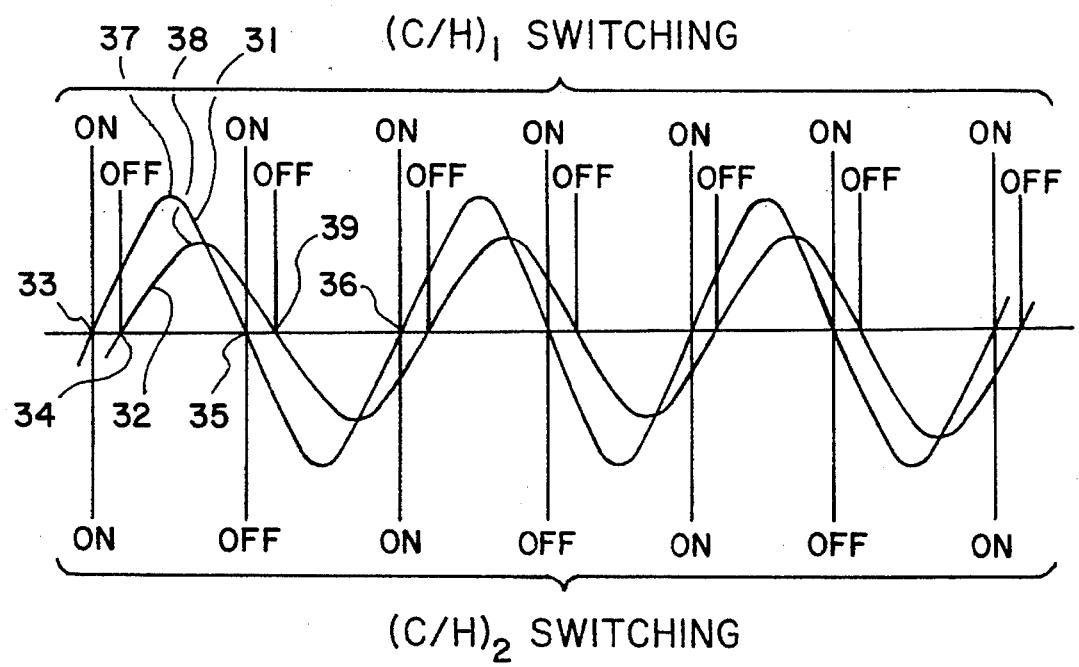
FIG. 3 illustrates an embodiment of the method of the present invention for determining the phase angle difference.

In FIG. 3 there is illustrated an embodiment of the method of the present invention for determining the phase angle difference between two alternating electrical signals 31 and 32 by using a data processing system such as those shown in FIGS. 1, and 2. The pulse counter $(C/H)_1$ such as the element 7 shown in FIG. 1 or the element 24 shown in FIG. 2, starts counting the pulses generated by the pulse generator at an instant when a zero value 33 of the leading signal 31 occurs and stops counting at an instant when a zero value 34 of the trailing signal 32 occurs. The number of pulses counted by the pulse counter (C/H)$_1$ is held thereby until the number of pulse count is transmitted to a data processor such as the elements 16 and 29 respectively included in the embodiments shown in FIGS. 1 and 2. The pulse counter (C/H)$_1$ is reset to zero immediately after the number of pulse count is transmitted to a data processor and well before the starting of the following cycle of the pulse counting switched on by the occurrence of zero value 35 of the leading signal 31 if the number of pulse count is taken every half cycle of the alternating electrical signals, or by occurrence of zero value 36 of the leading signal if the number of pulse count is taken every cycle of the alternating electrical signals. For example, the transmitting of the number of pulse count from the pulse counter (C/H)$_1$ to the data processor may be triggered by occurence of peak value 37 of the leading signal and the resetting of the pulse counter (C/H)$_1$ can be triggered by occurrence of peak value 38 of the trailing signal 32, or the data transmitting and resetting may be automatically sequenced following a switch off of counting triggered by occurrence of zero value 34 of the trailing signal 32. The pulse counter (C/H)$_2$ starts counting at an instant when a zero value 33 of the leading signal occurs and stops counting at an instant when the following zero value 35 of the leading signal 31 occurs. Of course, in an alternative mode of operation, the pulse counter (C/H)$_2$ may start counting by occurrence of zero value 34 and stop counting by occurrence of zero value 39 of the trailing signal. The number of pulses counted by the pulse counter (C/H)$_2$ is transmitted to the data processor and the pulse counter (C/H)$_2$ is reset before the starting of the following cycle of counting. The counters (C/H)$_1$ and (C/H)$_2$ represent the pair of pulse counters 7 and 8 shown in FIG. 1 or the pair of pulse counters 24 and 25 shown in FIG. 2.

The method of pulse counting illustrated in FIG. 3 can be summarized as follows: The first pulse counter (C/H)$_1$ takes a first number of pulse count equal to n, that is equal to the number of pulses occurring in a time interval between a zero value of the leading signal and a zero value of the trailing signal occurring immediately after the occurrence of the zero value of the leading signal. The second pulse counter (C/H)$_2$ takes a second number of pulse count equal to N, that is equal to the number of pulses occurring during one half of the period of the alternating electrical signals. It is immediately recognized that the phase angle difference between the two alternating electrical signals is related to the two numbers of pulse counts n and N by equation $$\Delta\phi(\text{radian}) = \frac{n}{N} \pi. \tag{17}$$

The data processor receives the two numbers of pulse counts n and N from the two pulse counters (C/H)$_1$ and (C/H)$_2$ and determines the phase angle difference between the two alternating electrical signals as a function of the two numbers of pulse counts n and N, or directly determines the mass flow rate of media as a function of the two numbers of pulse counts n and N. It follows from equations (13), (15) and (17) that the mass flow rate of media is related to the two numbers of pulse counts n and N by one of the following forms of equation:

$$\dot{M} = C_1 \tan \frac{n}{N} \pi, \tag{18}$$

$$\dot{M} = C_2 \frac{n}{N}, \tag{19}$$

$$\dot{M} = C_3 \frac{1}{f} \tan \frac{n}{N} \pi, \tag{20}$$

$$\dot{M} = C_4 \frac{n}{fN}, \tag{21}$$

$$\dot{M} = C_5 f \tan \frac{n}{N} \pi, \tag{22}$$

and $$\dot{M} = C_6 f \frac{n}{N}, \tag{23}$$

where $C_1$ through $C_6$ are constants of proportionality, which are empirically determined by calibrating the mass flowmeter and f is the frequency of the flexural vibration of the conduit included in the mass flowmeter. It should be understood that, when the mass flow rate of media is determined by using one of equations (18) through (23), the pulse generator can generate electric pulses in an errant manner without introducing any error in the measurement of the mass flow rate because numerical values of the ratio between the two numbers of pulse counts n and N remain accurate independent of fluctuating values of the frequency of the pulses generated by the errant pulse generator. If the electric pulse generator generates pulses at a precisely constant frequency, and the frequency of the flexural vibration of the conduit remains reasonably constant, equations (19), (21) and (23) can be written in the forms $$\dot{M} = C_7 n, \tag{24}$$

$$\dot{M} = C_8 \frac{n}{f}, \tag{25}$$

and $$\dot{M} = C_9 fn, \tag{26}$$

It should be noticed that, when the mass flow rate of media is determined by one of equations (24), (25) and (26), only one pulse counter (C/H)$_1$ shown in FIGS. 1 and 2 is needed. It should be mentioned that, when the mass flow rate of media is determined by one of equations (18) through (26) and the pulse counter (C/H)$_1$ has an error $\delta$ in counting the number of pulse count n, the mass flow rate of media determined from the pulse count including an error has an error proportional to the counting error. The phase angle difference, and the mass and volume flow rate determined by equation (17) is free of such an error.

Figure 4:
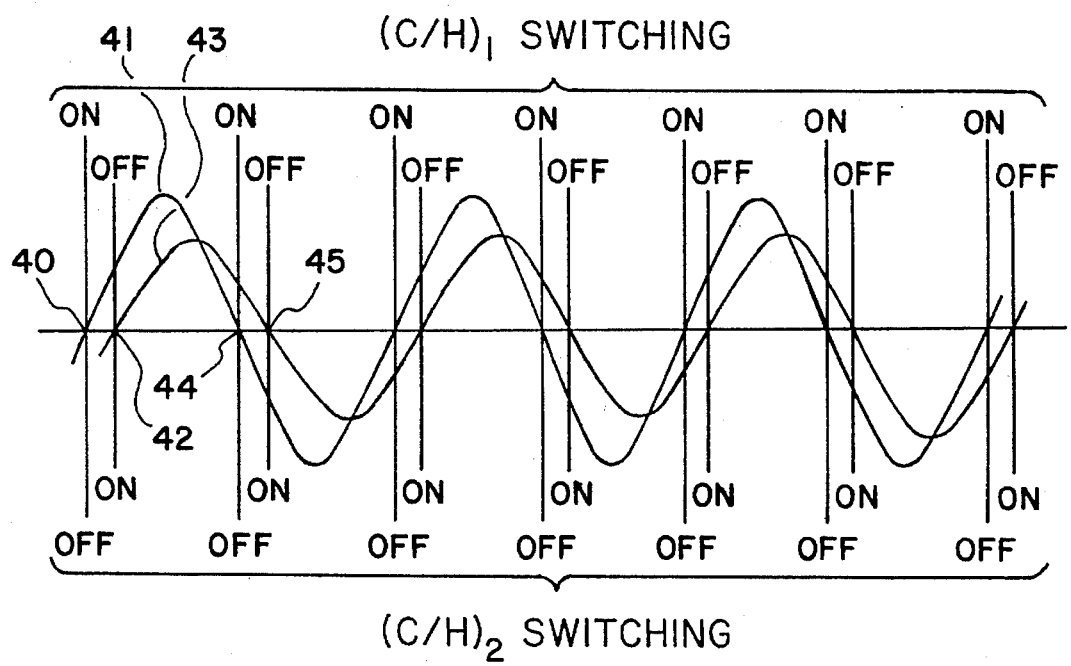
FIG. 4 illustrates a modified version of the method for determining the phase angle difference shown in FIG. 3.

In FIG. 4 there is illustrated a modified version of the method for determining the phase angle difference shown and described in conjunction with FIG. 3. The first pulse counter (C/H)$_1$ takes a first number of pulse count $N_1$ occurring in a time interval between a zero value 40 of the leading signal 41 and a zero value 42 of the trailing signal 43 occurring immediately after the occurrence of the zero value 40 of the leading signal 41. The second pulse counter (C/H)$_2$ takes a second number of pulse count $N_2$ occurring in a time interval between a zero value 42 of the trailing signal 43 and a zero value 44 of the leading signal 41 occurring immediately after the zero value 42 of the trailing signal 43. It is immediately recognized that $$N_1 = n, \tag{27}$$

and $$N_2 = N - n. \tag{28}$$

When equations (27) and (28) are simultaneously solved for n and N, the following equations result:

$$n = N_1, \quad (29)$$
$$N = N_1 + N_2, \quad (30)$$
and
$$\Delta\phi = \frac{N_1}{N_1 + N_2} \pi. \quad (31)$$

The mass flow rate of media is determined from one of equations (18) through (26) by substituting the values of n and N given by equations (29) and (30). Of course, the phase angle difference is given by equation (31). In an alternative mode of operation, that is a modified version of the method providing equations (29) through (31), the second pulse counter $(C/H)_2$ may take a pulse count $N_3$ occurring in a time interval between a zero value 40 of the leading signal 41 and the second zero value 45 of the trailing signal 43 occurring after the occurrence of the zero value 40 of the leading signal 41. It is readily recognized that $$N_3 = N + n, \quad (32)$$

It follows from equation (27) and (32) that $$n = N_1, \quad (29)$$
$$N = N_3 - N_1, \quad (33)$$
and
$$\Delta\phi = \frac{N_1}{N_3 - N_1} \pi. \quad (34)$$

Substitution of equations (29) and (33) into one of equations (18) through (26) yields the mass flow rate. The phase angle difference is determined by equation (34).

Figure 5:
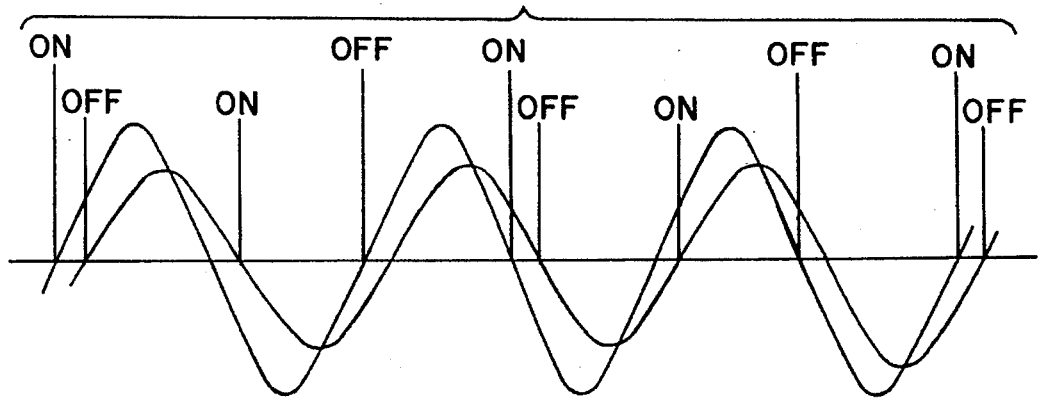
FIG. 5 illustrates an alternative method for determining the phase angle difference, which provides essentially the same result as those methods illustrated in FIGS. 3 and 4.

In FIG. 5 there is illustrated an embodiment of the method for determining the phase angle difference, that is an alternative to the embodiments shown in FIGS. 3 and 4. In this embodiment, a single pulse counter (C/H) alternatively takes the two numbers of pulse counts $N_1 = n$ and $N_2 = N-n$ (or $N_1 = n$ and $N_3 = N+n$). A data processor directs the two numbers of the pulse counts into two separate channels and determines the phase angle difference or the mass flow rate of media directly as a function of the two numbers of pulse counts.

Figure 6:
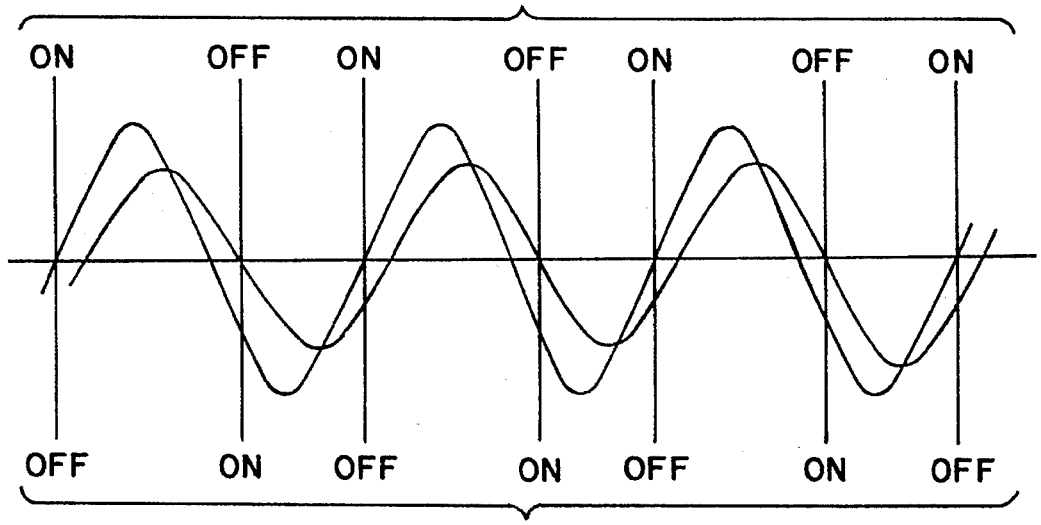
FIG. 6 illustrates another embodiment of the method of the present invention for determining the phase angle difference.

In FIG. 6 there is illustrated another embodiment of the method of the present invention for determining the phase angle difference. The first pulse counter $(C/H)_1$ takes a first number of pulse count $N_1 = N + n$ occurring in a time period between a zero value of the leading signal and the second zero value of the trailing signal occurring after the occurrence of the zero value of the leading signal, while the second pulse counter $(C/H)_2$ takes a second number of pulses $N_2 = N - n$ occurring in a time period between a zero value of the trailing signal and the first zero value of the leading signal occurring after the occurrence of the zero value of the trailing signal. The two numbers of pulse counts provides the following equations:

$$n = (N_1 - N_2)/2, \quad (35)$$
$$N = (N_1 + N_2)/2, \quad (36)$$
and
$$\Delta\phi = \frac{N_1 - N_2}{N_1 + N_2} \pi. \quad (37)$$

Substitution of equations (35) and (36) into one of equations (18) through (26) provides an equation, that determines the mass flow rate of media as a function of the phase angle difference.

Figure 7:
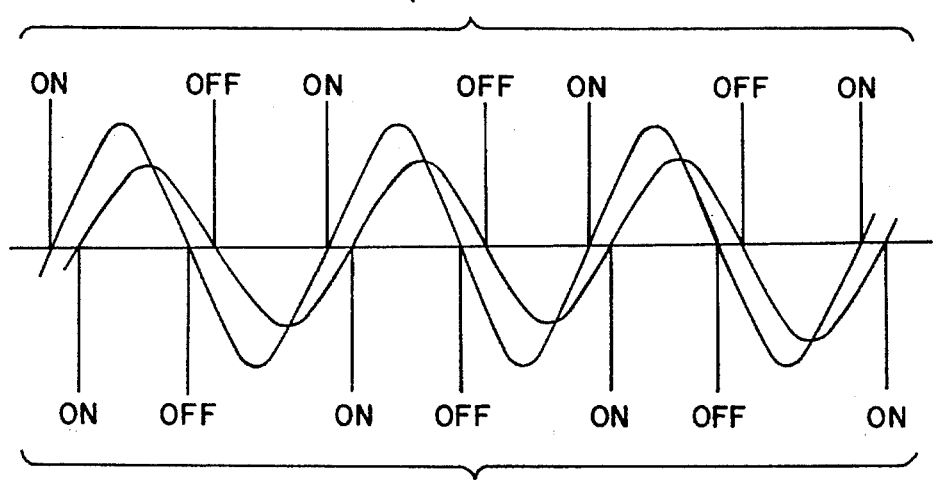
FIG. 7 illustrates a modified version of the method for determining the phase angle difference shown in FIG. 6.

In FIG. 7 there is illustrated a modified version of the method for determining the phase angle difference shown in FIG. 6, wherein the two numbers of pulse counts are taken within the same half cycle of the alternating electrical signals, while the two numbers of pulse counts are respectively taken alternatively within two adjacent half cycles of the alternating electrical signals in the method shown in FIG. 6.

Figure 8:
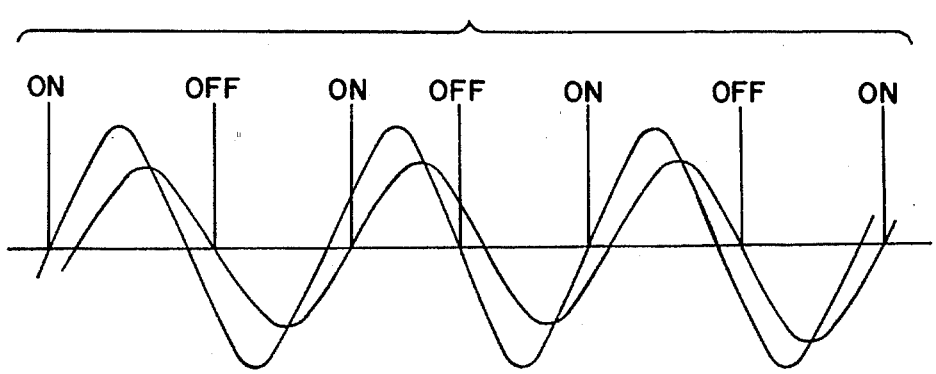
FIG. 8 illustrates an alternative method for determining the phase angle difference, which provides essentially the same result as those methods illustrated in FIGS. 6 and 7.

In FIG. 8 there is illustrated an alternative to the methods shown in FIGS. 6 and 7. In this embodiment, a single counter (C/H) takes the two numbers of pulse counts satisfying equations (35) through (37) in an alternating pattern in an operating mode similar to that shown and described in conjunction with FIG. 5.

Figure 9:
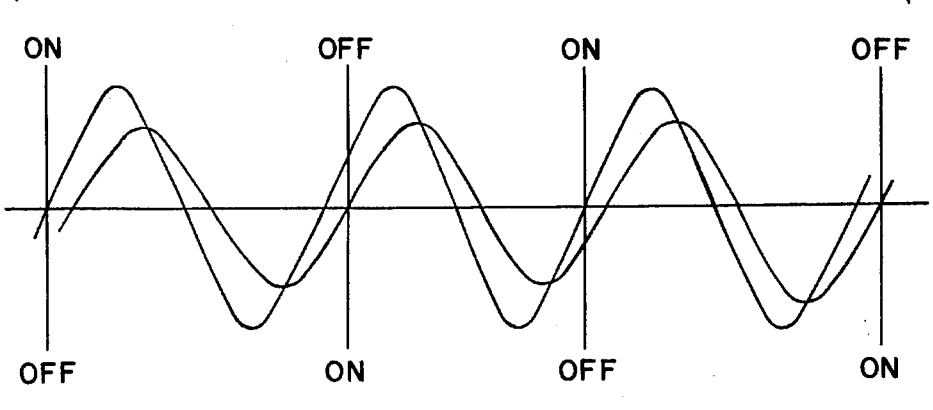
FIG. 9 illustrates a further embodiment of the method of the present invention for determining the phase angle difference.

In FIG. 9 there is illustrated a further embodiment of the method of the present invention for determining the phase angle difference. The first pulse counter $(C/H)_1$ takes a first number of pulse count $N_1 = 2N + n$ occurring in a time interval between a zero value of the leading signal and the the third zero value of the trailing signal occurring after the occurrence of the zero value of the leading signal, while the second pulse counter $(C/H)_2$ takes a second number of pulse count $N_2 = 2N - n$ occurring in a time interval between a zero value of the trailing signal and the second zero value of the leading signal occurring after the occurrence of the zero value of the trailing signal, which two numbers of pulse counts satisfy the following equations:

$$n = (N_1 - N_2)/2, \quad (38)$$
$$N = (N_1 + N_2)/4, \quad (39)$$
and
$$\Delta\phi = \frac{2(N_1 - N_2)}{N_1 + N_2} \pi. \quad (40)$$

Substitution of equations (38) and (39) into one of equations (18) through (26) provides an equation determining the mass flow rate of media.

Figure 10:
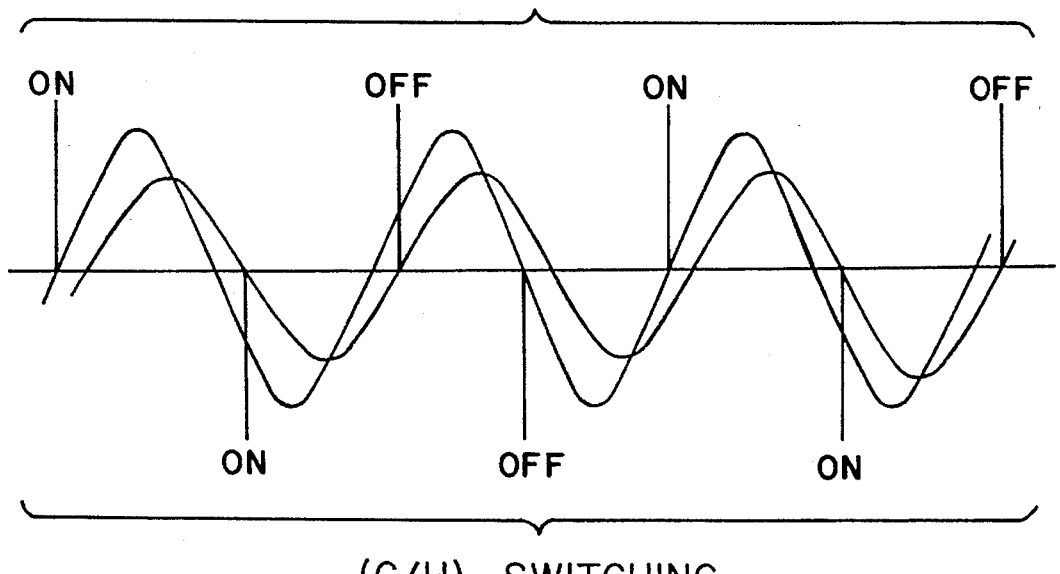
FIG. 10 illustrates a modified version of the method for determining the phase angle difference shown in FIG. 9.

In FIG. 10 there is illustrated a modified version of the method for determining the phase angle difference shown in FIG. 9. In this particular illustrative embodiment, the two numbers of pulse counts are taken respectively at two time intervals separated from one another by nearly a half period of the alternating electrical signals, while the two numbers of pulse counts are taken respectively at two time intervals separated from one another by nearly a full period in the method shown in FIG. 9.

Figure 11:
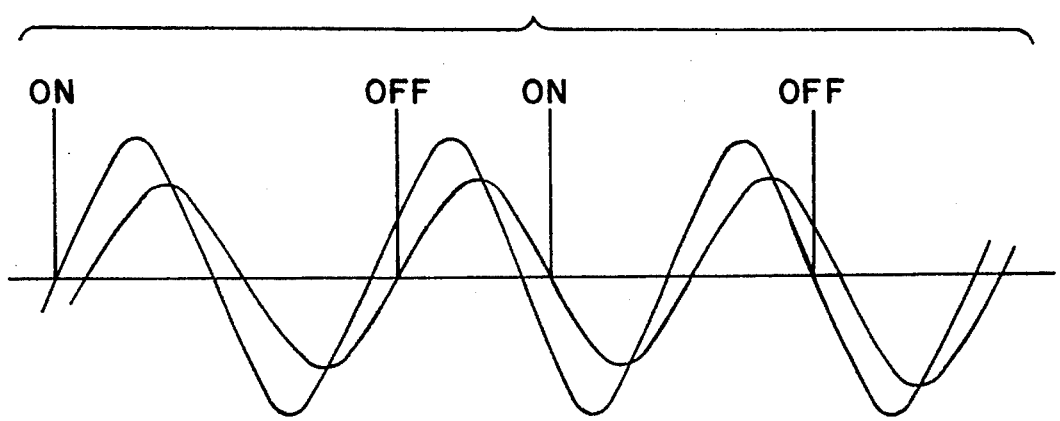
FIG. 11 illustrates an alternative method for determining the phase angle difference, which provides essentially the same result as those methods illustrated in FIGS. 9 and 10.

In FIG. 11 there is illustrated an alternative to the methods shown in FIGS. 9 and 10. In this particular embodiment, the two numbers of pulse counts $N_1$ and $N_2$ are taken by a single pulse counter (C/H) in an alternating manner similar to that described shown and described in conjunction with FIG. 5.

It should be mentioned that the two numbers of pulse counts $N_1$ and $N_2$ defined in conjunction with FIGS. 3–11 can be taken as frequently as possible or in an intermittent mode wherein the two numbers of pulse counts are taken at a desired frequency by skipping a certain number of opportunities available for the data taking. The methods for determining the phase angle difference and for determining the mass flow rate or the volume flow rate as a function of the two numbers of pulse counts $N_1$ and $N_2$, of which illustrative embodiments are shown and described in conjunction with FIGS. 3–11, can be generalized and summarized as follows: In the first embodiment of the method, the first number of pulse count $N_1$ is obtained by counting the number of pulses generated by a pulse generator by using at least one pulse counter, that starts counting with occurrence of a zero value of the leading signal of the two alternating electrical signals and stops counting with the (i−1)th occurrence of zero value of the trailing signal of the two alternating electrical signals after the occurrence of zero value of the leading signal, where (i) is equal to an integer. The first number of pulse count $N_1$ so obtained is equal to $$N_1=(i-1)N+n, \quad (41)$$

where N is equal to the number of pulses occurring in a time interval equal to one half of the period of the alternating electrical signals, and n is equal to the number of pulses occurring in a time interval between an occurrence of a zero value of the leading signal and the occurrence of a zero value of the trailing signal immediately after the occurrence of zero value of the leading signal. The second number of pulse count $N_2$ is obtained by counting the number of pulses by using the same pulse counter counting the first number of pulse count or another pulse counter, that starts counting with occurrence of a zero value of the trailing signal and stops counting with the (j)th occurrence of zero value of the leading signal after the occurrence of zero value of the trailing signal, where (j) is equal to an integer. The second number of pulse count $N_2$ is equal to $$N_2=(j)N-n. \quad (42)$$

Equations (41) and (42) can be combined to obtain the following equations:

$$n = \frac{(j)N_1 - (i-1)N_2}{(i+j-1)}, \quad (43)$$

and $$N = \frac{N_1 + N_2}{(i+j-1)}. \quad (44)$$

The phase angle difference between the two alternating electrical signals is equal to $(\pi n/N)$ and, consequently, is given by equation $$\Delta\phi = \frac{(j)N_1 - (i-1)N_2}{N_1 + N_2} \pi. \quad (45)$$

The best result is obtained, when the two integers (i) and (j) are selected in such a way that (i)=(k+1) and (j)=(k), where (k) is equal to an integer. In such a case, equation (45) reduces to $$\Delta\phi = \frac{k(N_1 - N_2)}{N_1 + N_2} \pi. \quad (46)$$

The beauty of determining the phase angle difference as a function of the two numbers of pulse counts $N_1$ and $N_2$ by using equation (46) is that, even if the pulse counting is erratic and introduces the same error in counting the first and second numbers of pulse countings, the phase angle difference determined by equation (46), and the mass flow rate or the volume flow rate determined as a function of the phase angle determined by equation (46), are free of any errors because the counting errors included in the two numbers of pulse countings $N_1$ and $N_2$ cancel one another in the differential combination of the two numbers of pulse counts.

A much more accurate value of the phase angle difference can be obtained, when a summation of the first number of pulse count $N_1$ accumulated over a plurality of cycles of counting thereof, and a summation of the second number of pulse count $N_2$ accumulated over a plurality of cycles of counting thereof are used in place of the two numbers of pulse counts $N_1$ and $N_2$. It can be readily shown that the phase angle difference is related to the two cumulative summations of the two numbers of pulse counts by the following equation:

$$\Delta\phi = \frac{k[(\Sigma N_1) - (\Sigma N_2)]}{(\Sigma N_1) + (\Sigma N_2)} \pi. \quad (47)$$

The cumulative summation $(\Sigma N_1)$ of the first number of pulse count $N_1$, and the cumulative summation of $(\Sigma N_2)$ of the second number of pulse count $N_2$ are respectively taken by the two cumulative counters 27 and 28 included in the embodiment shown in FIG. 2.

In the second embodiment of the method of the present invention for determining the phase angle difference, the first number of pulse count $N_1$ is obtained by using at least one pulse counter, that starts counting with occurrence of a zero value of one of the two alternating electrical signals and stops counting with the (p)th occurrence of zero value of the other of the two alternating electrical signals occurring after the occurrence of zero value of said one of the two alternating electrical signals, where (p) is an integer. The first number of pulse count so obtained is related to N and n by equation $$N_1=(p-1)N+n, \quad (48)$$

$$N_1=(p)N-n. \quad (49)$$

The second number of pulse count $N_2$ is obtained by using the same pulse counter counting the first number of pulse count or another pulse counter, that starts counting with occurrence of a zero value of either one of the two alternating electrical signals and stops counting with the (q)th occurrence of zero value of said either one of the two alternating electrical signals occurring after the occurrence of zero value of said either one of the two alternating electrical signals, where (q) is an integer. The second number of pulse count so obtained is related to N by equation $$N_2=(q)N. \quad (50)$$

Substitution of equation (50) into equation (48) or (49) yields the following equations:

$$\Delta\phi = \frac{(q)N_1 - (p-1)N_2}{N_2} \pi, \quad (51)$$

or $$\Delta\phi = \frac{(p)N_2 - (q)N_1}{N_2} \pi. \quad (52)$$

The best result is obtained, when the integers are set equal to (p)=(k+1) and (q)=(k) in equation (51), and (p)=(q)=(k), where (k) is an integer, in which cases equations (51) and (52) reduce to $$\Delta\phi = \frac{k(N_1 - N_2)}{N_2} \pi \quad (53)$$

and $$\Delta\phi = \frac{k(N_2 - N_1)}{N_2} \pi. \quad (54)$$

As described in conjunction with equation (47), an improved result can be obtained when the cumulative summation of the two numbers of pulse counts are respectively substituted for the two numbers of pulse counts $N_1$ and $N_2$ in equations (53) and (54).

$$\Delta\phi = \frac{k[(\Sigma N_1) - (\Sigma N_2)]}{(\Sigma N_2)} \pi, \quad (55)$$

and $$\Delta\phi = \frac{k[(\Sigma N_2) - (\Sigma N_1)]}{(\Sigma N_2)} \pi. \quad (56)$$

It should be understood that the two numbers of pulse counts $N_1$ and $N_2$ may be obtained by using a single pulse counter as described in conjunction with FIGS. 5, 8 and 11, or by using a pair of pulse counters as described in conjunction with FIGS. 3, 4, 6, 7, 9 and 10. When the pulse generator generates pulses at a constant frequency, and the conduit is flexurally vibrated at a constant frequency, the denominators in terms appearing on the right hand side of equations (45) through (47) and (51) through (56) become a constant, and consequently, the phase angle difference, or the mass flow rate, or the volume flow rate can be determined as a function of the numerator in one of the terms appearing on the right hand sides of equations (45) through (47) and (51) through (56). It should be mentioned that the phase angle difference given by equations (45) through (47) and (51) through (56) is proportional to a ratio of a differential combination of the two numbers of pulse counts $N_1$ and $N_2$ to an additive combination of the two numbers of pulse counts $N_1$ and $N_2$, and consequently, the phrases "phase angle difference" and "ratio of a differential combination to an additive combination of the two numbers of pulse counts" are used as synonyms as far as defining a function (mathematical function) thereof. It should be understood that peak values or other values of the two alternating electrical signals may be used in place of the zero values of the two alternating electrical signals as reference timings for starting and stopping of the counting by the pulse counters, while the zero values of the two alternating electrical signals provide the most desirable reference timings for the control of the pulse counters. Therefore, the methods of the present invention for determining the phase angle difference may use the reference timings provided by zero values and/or peak values of the two alternating electrical signals.

In direct applications of the method of the present invention for determining the phase angle difference, a convective inertia force flowmeter (Coriolis force flowmeter) determines the mass flow rate of media moving through a single or a pair of vibrating conduits as a function of a differential combination of the two numbers of pulse counts $N_1$ and $N_2$, or as a function of the ratio of a differential combination of the two numbers of pulse counts to an additive combination of the two numbers of pulse counts. Of course, a cumulative summation of each of the two numbers of pulse counts may be used in place of each of the two numbers of pulse counts in determining the phase angle difference, the mass flow rate of media, the volume flow rate of fluids, and other applications.

While the principles of the inventions have now been made clear by the illustrative embodiments, there will be many modifications of the methods and the mathematical relationships, which are immediately obvious to those skilled in the art and particularly adapted to the specific working environments and operating conditions in the practice of the inventions without departing from those priciples. It is not desired to limit the inventions to those illustrative embodiments shown and described and, accordingly, all suitable modifications and equivalents may be regarded as falling within the scope of the inventions as defined by the claims which follow.

The embodiments of the inventions, in which an exclusive property or privilege is claimed, are defined as follows:

1. A method for determining a phase angle difference between two alternating electrical signals comprising in combination:

a) generating a series of electric pulses by an electrical pulse generator;

b) counting number of pulses generated by the electrical pulse generator by using pulse counting means, wherein said pulse counting means includes means for switching on to start counting and means for switching off to stop counting;

c) obtaining a first number of pulse count by switching on the pulse counting means with an occurrence of one of zero value and peak values of leading signal of two alternating electrical signals and switching off the pulse counting means with (i−1)th occurrence of one of zero value and peak value of trailing signal of the two alternating electrical signals occurring after the occurrence of said one of zero value and peak value of the leading signal, wherein (i) is an integer;

d) obtaining a second number of pulse count by switching on the pulse counting means with an occurrence of one of zero value and peak value of the trailing signal and switching off the pulse counting means with (j)th occurrence of one of zero value and peak value of the leading signal occurring after the occurrence of said one of zero value and peak value of the trailing signal, wherein (j) is an integer; and e) forming a differential combination of the first number of pulse count and the second number of pulse count as a measure of a phase angle difference between the two alternating electrical signals.

2. A method as defined in claim 1 wherein the integers (i) and (j) satisfy a relationship (i−1)=(j).

3. A method as defined in claim 2 determining mass flow rate of media moving through at least one conduit under flexural vibration as a function of the differential combination of the first number of pulse count and the second number of pulse count; wherein the two alternating electrical signals are respectively provided by a pair of motion sensors respectively included in two opposite halves of the conduit, and represent flexural vibration of the conduit respectively occurring at two sections of the conduit respectively belonging to the two opposite halves of the conduit.

4. A method as defined in claim 2 forming a cumulative summation of the differential combination of the first number of pulse count and the second number of pulse count summed over a plurality of cycles of counting by the pulse counting means.

5. A method as defined in claim 4 determining mass flow rate of media moving through at least one conduit under flexural vibration as a function of the differential combination of the first number of pulse count and the second number of pulse count; wherein the two alternating electrical signals are respectively supplied by a pair of motion sensors respectively included in two opposite halves of the conduit, and represent flexural vibration of the conduit respectively occurring at two sections of the conduit respectively belonging to the two opposite halves of the conduit.

6. A method as defined in claim 1 forming a ratio of the differential combination of the first number of pulse count and the second number of pulse count to an additive combination of the first number of pulse count and the second number of pulse count.

7. A method as defined in claim 6 determining a phase angle difference between the two alternating electrical signals as a function of the ratio of the differential combination of the first and second numbers of pulse counts to the additive combination of the first and second numbers of pulse counts.

8. A method as defined in claim 6 determining mass flow rate of media moving through at least one conduit under flexural vibration as a function of the ratio of the differential combination of the first and second numbers of pulse counts to the additive combination of the first and second numbers of pulse counts; wherein the two alternating electrical signals are respectively generated by a pair of motion sensors respectively included in two opposite halves of the conduit, and represent flexural vibration of the conduit respectively occurring at two sections of the conduit respectively belonging to the two opposite halves of the conduit.

9. A method as defined in claim 2 forming a ratio of a cumulative summation of the differential combination of the first and second numbers of pulse counts summed over a plurality of cycles of counting by the pulse counting means to a cumulative summation of an additive combination of the first and second numbers of pulse counts summed over a plurality of cycles of counting by the pulse counting means.

10. A method as defined in claim 9 determining a phase angle difference between the two alternating electrical signals as a function of the ratio of the cumulative summation of the differential combination of the first and second numbers of pulse counts to the cumulative summation of the additive combination of the first and second numbers of pulse counts.

11. A method as defined in claim 9 determining mass flow rate of media moving through at least one conduit under flexural vibration as a function of the ratio of the cumulative summation of the differential combination of the first and second numbers of pulse counts to the cumulative summation of the additive combination of the first and second numbers of pulse counts; wherein the two alternating electrical signals are respectively generated by a pair of motion sensors respectively included in two opposite halves of the conduit, and represent flexural vibration of the conduit respectively occurring at two sections of the conduit respectively belonging to the two opposite halves of the conduit.

12. A method for determining a phase angle difference between two alternating electrical signals comprising in combination:

a) generating a series of electric pulses by an electrical pulse generator;

b) counting number of pulses generated by the electrical pulse generator by using pulse counting means, wherein said pulse counting means includes means for switching on to start counting and means for switching off to stop counting;

c) obtaining a first number of pulse count by switching on the pulse counting means with an occurrence of one of zero value and peak value of one of the two alternating electrical signals and switching off the pulse counting means with (i)th occurrence of one of zero value and peak value of the other of the two alternating electrical signals occurring after the occurrence of said one of zero value and peak value of said one of the two alternating electrical signals, wherein (i) is an integer;

d) obtaining a second value of pulse count by switching on the pulse counting means with an occurrence of one of zero value and peak value of either one of the two alternating electrical signals and switching off the pulse counting means with (j)th occurrence of one of zero value and peak value of said either one of the two alternating electrical signals occurring after the occurrence of said one of zero value and peak value of said either one of the two alternating electrical signals, wherein (j) is an integer; and e) forming a differential combination of the first number of pulse count and the second number of pulse count as a measure of a phase angle difference between the two alternating electrical signals.

13. A method as defined in claim 12 wherein the integers (i) and (j) satisfy one of two relationships (i−1)=(j) or (i)=(j)>1.

14. A method as defined in claim 13 determining mass flow rate of media moving through at least one conduit under flexural vibration as a function of the differential combination of the first number of pulse count and the second number of pulse count; wherein the two alternating electrical signals are respectively supplied by a pair of motion sensors respectively included in two opposite halves of the conduit, and represent flexural vibration of the conduit respectively occurring at two sections of the conduit respectively belonging to the two opposite halves of the conduit.

15. A method as defined in claim 13 forming a cumulative summation of the differential combination of the first number of pulse count and the second number of pulse count summed over a plurality of cycles of counting by the pulse counting means.

16. A method as defined in claim 15 determining mass flow rate of media moving through at least one conduit under flexural vibration as a function of the cumulative summation of the differential combination of the first number of pulse count and the second number of pulse count; wherein the two alternating electrical signals are respectively generated by a pair of motion sensors respectively included in two opposite halves of the conduit, and represent flexural vibration of the conduit respectively occurring at two sections of the conduit respectively belonging to the two opposite halves of the conduit.

17. A method as defined in claim 12 forming a ratio of the differential combination of the first number of pulse count and the second number of pulse count to the second number of pulse count.

18. A method as defined in claim 17 determining a phase angle difference between the two alternating electrical signals as a function of the ratio of the differential combination of the first and second numbers of pulse counts to the second number of pulse count.

19. A method as defined in claim 17 determining mass flow rate of media moving through at least one conduit under flexural vibration as a function of the ratio of the differential combination of the first and second numbers of pulse counts to the second number of pulse count; wherein the two alternating electrical signals are respectively generated by a pair of motion sensors respectively included in two opposite halves of the conduit, and represent flexural vibration of the conduit respectively occurring at two sections of the conduit respectively belonging to the two opposite halves of the conduit.

20. A method as defined in claim 13 forming a ratio of a cumulative summation of the differential combination of the first and second numbers of pulse counts summed over a plurality of cycles of counting by the pulse counting means to a cumulative summation of the second number of pulse count summed over a plurality of cycles of counting by the pulse counting means.

21. A method as defined in claim 20 determining a phase angle difference between the two alternating electrical signals as a function of the ratio of the cumulative summation of the differential combination of the first and second numbers of pulse counts to the cumulative summation of the second number of pulse count.

22. A method as defined in claim 20 determining mass flow rate of media moving through at least one conduit under flexural vibration as a function of the ratio of the cumulative summation of the differential combination of the first and second numbers of pulse counts to the cumulative summation of the second number of pulse count; wherein the two alternating electrical signals are respectively generated by a pairs of motion sensors respectively included in two opposite halves of the conduit, and represent flexural vibration of the conduit respectively occurring at two sections of the conduit respectively belonging to the two opposite halves of the conduit.

* * * * *